(12) United States Patent
Lee

(10) Patent No.: US 9,331,070 B2
(45) Date of Patent: May 3, 2016

(54) VARIABLE CAPACITOR AND INTEGRATED CIRCUIT INCLUDING THE SAME

(71) Applicant: Samsung Electro-Mechanics Co., Ltd., Suwon, Gyunggi-do (KR)

(72) Inventor: Seung Seoup Lee, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 626 days.

(21) Appl. No.: 13/670,072

(22) Filed: Nov. 6, 2012

(65) Prior Publication Data

US 2014/0049119 A1 Feb. 20, 2014

(30) Foreign Application Priority Data

Aug. 20, 2012 (KR) .......................... 10-2012-0090691

(51) Int. Cl.
*H01L 27/08* (2006.01)
*H03K 17/56* (2006.01)
*H01L 49/02* (2006.01)

(52) U.S. Cl.
CPC ............ *H01L 27/0808* (2013.01); *H01L 28/40* (2013.01); *H03K 17/56* (2013.01); *H03J 2200/10* (2013.01)

(58) Field of Classification Search
CPC . H03K 17/56; H03J 2200/10; H01L 27/0808; H01L 28/40
See application file for complete search history.

(56) References Cited

U.S. PATENT DOCUMENTS

| | | | | |
|---|---|---|---|---|
| 6,013,958 | A | * | 1/2000 | Aytur ............................ 307/109 |
| 8,169,270 | B2 | * | 5/2012 | Zeng et al. .................... 331/179 |
| 8,604,864 | B2 | * | 12/2013 | Ranta et al. ................... 327/427 |
| 2010/0283551 | A1 | | 11/2010 | Zeng et al. |
| 2011/0002080 | A1 | | 1/2011 | Ranta |

* cited by examiner

*Primary Examiner* — Zeev V Kitov
(74) *Attorney, Agent, or Firm* — NSIP Law

(57) ABSTRACT

There are provided a variable capacitor and an integrated circuit (IC) including the variable capacitor. The variable capacitor includes: a plurality of capacitance forming portions that are connected to each other in parallel between a first port and a second port and provide previously set capacitance according to a control signal, wherein each of the plurality of capacitance forming portions includes: a first capacitance forming portion including a first switch portion including a plurality of switches, and a first capacitor portion including first and second capacitors; and at least one capacitance forming group including a unit switch portion including a plurality of switches, and at least one unit capacitance forming portion including at least one unit capacitor portion including a unit capacitor.

23 Claims, 9 Drawing Sheets

VARIABLE CAPACITOR AND INTEGRATED CIRCUIT INCLUDING THE SAME

CROSS-REFERENCE TO RELATED APPLICATIONS

This application claims the priority of Korean Patent Application No. 10-2012-0090691 filed on Aug. 20, 2012, in the Korean Intellectual Property Office, the disclosure of which is incorporated herein by reference.

BACKGROUND OF THE INVENTION

1. Field of the Invention

The present invention relates to a variable capacitor having variable capacitance according to a control signal and an integrated circuit (IC) including the variable capacitor.

2. Description of the Related Art

As a recently wireless communications technology has been developed, 4G mobile communications, supporting long term evolution (LTE) has been prominent in addition to the current 3G mobile communications technology.

As 4G mobile communications networking is added to existing 3G mobile communications networking, there is an increase in communications techniques supported in a single mobile communications terminal.

Accordingly, a radio frequency (RF) function of a mobile communications terminal needs to cover various frequency bands by using a single RF chain, and needs to optimize front-end matching including an antenna and power consumed by a power amplifier (PA) while the mobile communications terminal is being used.

To implement such an RF function, a tunable matching circuit block is added to an existing front-end circuit. In this regard, a variable device may be used to perform a variable function, and accordingly, a variable capacitor is used.

The variable capacitor may include capacitors utilizing various techniques. Among these techniques, research into a metal-insulator-metal (MIM) technique using a CMOS process that is advantageous in terms of manufacturing costs has been actively conducted. An MIM capacitor may operate in connection with an MOS switch owing to its characteristics.

Such a MIM capacitor applies a digital control signal to a switch without an additional DAC and controls capacitance. As described in the related art document below, important parameters in the variable capacitor are a Q value that is a quality factor and a tuning range. To possess certain RF performance, the Q value must be maintained.

RELATED ART DOCUMENT

U.S. Patent Laid-Open Publication No. 2011/0002080

SUMMARY OF THE INVENTION

An aspect of the present invention provides a variable capacitor capable of maintaining a constant Q value and having improved power handling characteristics and harmonic characteristics and an integrated circuit (IC) including the variable capacitor.

According to an aspect of the present invention, there is provided a variable capacitor including: a plurality of capacitance forming portions that are connected to each other in parallel between a first port and a second port through which signals are input and output and provide previously set capacitance according to a control signal, wherein each of the plurality of capacitance forming portions includes: a first capacitance forming portion including a first switch portion including a plurality of switches that switch capacitance forming paths according to the control signal, and a first capacitor portion including first and second capacitors that have at least one switch of the first switch portion disposed therebetween and provide the paths formed according to the switching of the first switch portion with the previously set capacitance; and at least one capacitance forming group including a unit switch portion including a plurality of switches that switch capacitance forming paths according to the control signal, and at least one unit capacitance forming portion including at least one unit capacitor portion including a unit capacitor that is disposed between the first port and an initial switch of the unit switch portion and provides the paths formed according to the switching of the unit switch portion with the previously set capacitance.

The variable capacitor may further include: at least one second capacitance forming portion including a second switch portion including a plurality of switches that switch capacitance forming paths according to the control signal, and a second capacitor portion including a capacitor that is disposed between the first port and an initial switch of the second switch portion and provides the paths formed according to the switching of the second switch portion with the previously set capacitance.

The first and second capacitors may have the same capacitance.

The capacitance of the first and second capacitors may be the same as the capacitance of the second capacitor portion.

The capacitance of the first and second capacitors may be the same as the capacitance of the unit capacitor of the unit capacitor portion.

The at least one capacitance forming group may include a plurality of the unit capacitance forming portions.

Each of the plurality of the unit capacitance forming portions may include different amounts of the unit switch portions and the unit capacitor portions.

Each of the plurality of the unit capacitance forming portions may include the nth power of 2 (n is an integer equal to or greater than 0) number of the unit switch portions and the unit capacitor portions.

According to another aspect of the present invention, there is provided an integrated circuit (IC) including a variable capacitor including: the variable capacitor including a plurality of capacitance forming portions that are connected to each other in parallel between a first port and a second port through which signals are input and output and provide previously set capacitance according to a control signal, each of the plurality of capacitance forming portions including a first capacitance forming portion including a first switch portion including a plurality of switches that switch capacitance forming paths according to the control signal, and a first capacitor portion including first and second capacitors that have at least one switch of the first switch portion disposed therebetween and provide the paths formed according to the switching of the first switch portion with the previously set capacitance; and at least one capacitance forming group including a unit switch portion including a plurality of switches that switch capacitance forming paths according to the control signal, and at least one unit capacitance forming portion including at least one unit capacitor portion including a unit capacitor that is disposed between the first port and an initial switch of the unit switch portion and provides the paths formed according to the switching of the unit switch portion with the previously set capacitance; and a decoder that provides the control signal according to a control from the outside.

The IC may further include: an interface that transfers the control from the outside to the decoder by using a previously set interfacing method.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
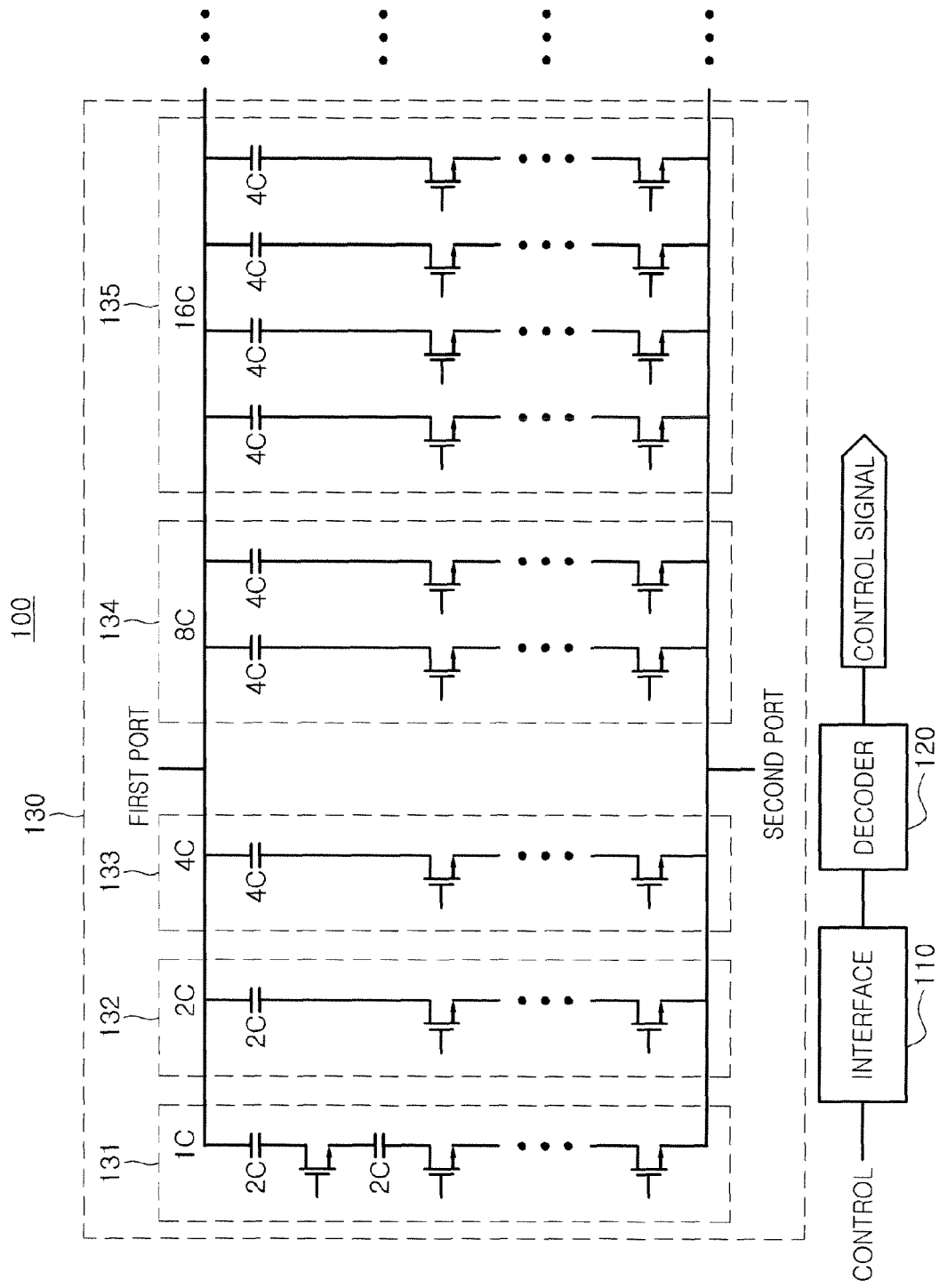
FIG. 1 is a schematic view of a construction of an integrated circuit (IC) including a variable capacitor according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

A case in which any one part is connected to the other part includes a case in which the parts are directly connected to each other and a case in which the parts are indirectly connected to each other with other elements interposed therebetween.

In addition, unless explicitly described otherwise, "comprising" any components will be understood to imply the inclusion of other components but not the exclusion of any other components.

FIG. 1 is a schematic view of a construction of an integrated circuit (IC) 100 including a variable capacitor 130 according to an embodiment of the present invention.

Referring to FIG. 1, the IC 100 including the variable capacitor 130 according to an embodiment of the present invention may include an interface 110, a decoder 120, and the variable capacitor 130.

The interface 110 may convert a control from an outside into a setting method such as a serial peripheral interface (SPI), an inter-integrated circuit (I2C), a mobile industry processor interface (MIPI), etc. and transfer the converted control to the decoder 120. The decoder 120 may provide a control signal used to turn each switch of the variable capacitor 130 on or off, and provide each switch or a gate corresponding to a switch row with a serial digital bit included in the control transferred from the interface 110.

The variable capacitor 130 may include a plurality of capacitance forming portions that are connected to each other in parallel between a first port and a second port to and from which signals are input and output and provide previously set capacitance according to the control signal. Each of the plurality of capacitance forming portions may include a first capacitance forming portion 131 and unit capacitance forming groups 133, 134, and 135 each including at least one unit capacitance forming portion, and may further include a second capacitance forming portion 132.

The first capacitance forming portion 131 may include a first switch portion including a plurality of switches that switch capacitance forming paths according to the control signal, and a first capacitor portion including first and second capacitors that have at least one switch of the first switch portion disposed therebetween and provide the paths formed according to the switching of the first switch portion with the previously set capacitance.

The second capacitance forming portion 132 may include a second switch portion including a plurality of switches that switch capacitance forming paths according to the control signal, and a second capacitor portion including a capacitor that is disposed between an initial switch of the second switch portion and the first port and that provides the paths formed according to the switching of the second switch portion with the previously set capacitance.

The respective unit capacitance forming groups 133, 134, and 135 may include a unit switch portion including a plurality of switches that switch capacitance forming paths according to the control signal, and at least one unit capacitance forming portion including at least one unit capacitor portion including a unit capacitor that is disposed between the first port and the initial switch of the unit switch portion and provides the paths formed according to the switching of the unit switch portion with the previously set capacitance.

For example, in the case of a 5-bit control variable capacitor, the variable capacitor 130 may include the first capacitance forming portion 131, the second capacitance forming portion 132, and the capacitance forming groups 133, 134, and 135 respectively including first through third unit capacitance forming units. The first and second capacitors of the first capacitance forming portion 131 may have the same capacitance as that of a capacitor of the second capacitance forming portion 132. In addition, an area of each of the plurality of switches of the first switch portion of the first capacitance forming portion 131 may be ½ of an area of each of the plurality of switches of the second switch portion of the second capacitance forming portion 132.

The respective capacitance forming groups 133, 134, and 135 may include first through third unit capacitance forming units 133, 134, and 135. Each of the first through third unit capacitance forming units 133, 134, and 135 may include at least one unit capacitance forming portion.

The number of the unit capacitance forming portions included in each of the first through third unit capacitance forming units 133, 134, and 135 may be the nth power of 2 (n is an integer equal to or greater than 0).

In the 5 bit control, the first unit capacitance forming unit 133 may include a single unit capacitance forming portion, the second unit capacitance forming unit 134 may include two unit capacitance forming portions connected to each other in parallel, and the third unit capacitance forming unit 135 may include four unit capacitance forming portions connected to one another in parallel.

Each of the unit capacitance forming portions may include a unit switch portion including a plurality of switches that switch capacitance forming paths according to the control signal, and a unit capacitor portion including a unit capacitor that is disposed between the first port and the initial switch of the unit switch portion and that provides the paths formed according to the switching of the unit switch portion with the previously set capacitance. Capacitance of the unit capacitor may have a capacitor two times greater than that of capacitance of the capacitor of the second capacitance forming portion 132. An area of each of the plurality of switches of the unit switch portion may be two times larger than an area of each of the plurality of switches of the second switch portion.

FIGS. 2 through 9 are schematic views of a construction of a variable capacitor employed in an IC according to embodiments of the present invention.

Referring to FIGS. 2 through 9, the variable capacitor employed in the IC of the present invention may be implemented in various embodiments.

Figure 2:
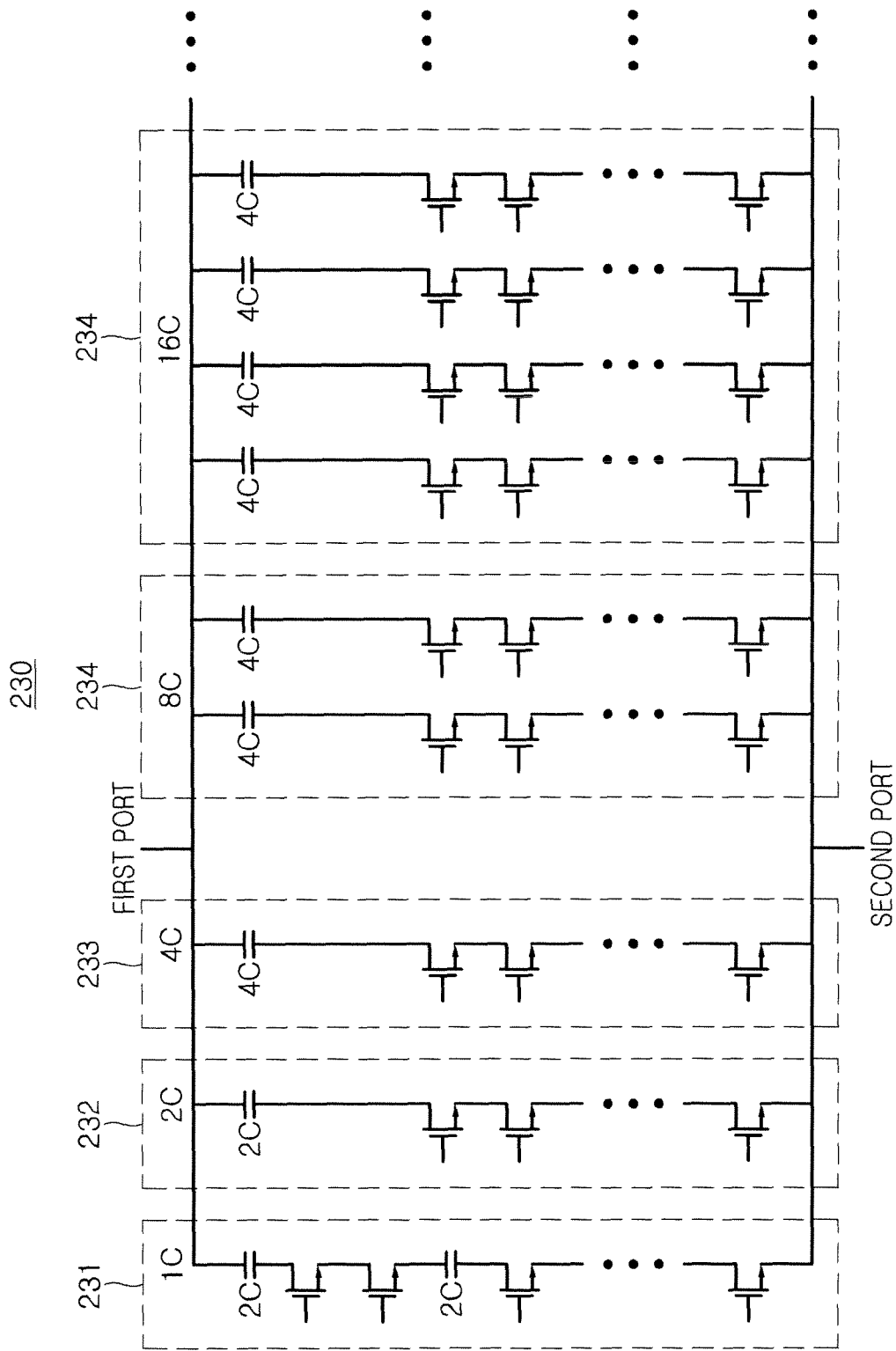
FIGS. 2 through 9 are schematic views of a construction of a variable capacitor employed in an IC according to embodiments of the present invention.

Referring to FIG. 2, two switches may be connected to each other in series between first and second capacitors of a first capacitance forming portion 231 of a variable capacitor 230 employed in the IC of the present invention. A second capacitance forming portion 232 and capacitance forming groups 233, 234, and 235 are the same as those of FIG. 1 and thus detailed descriptions thereof are omitted here.

Figure 3:
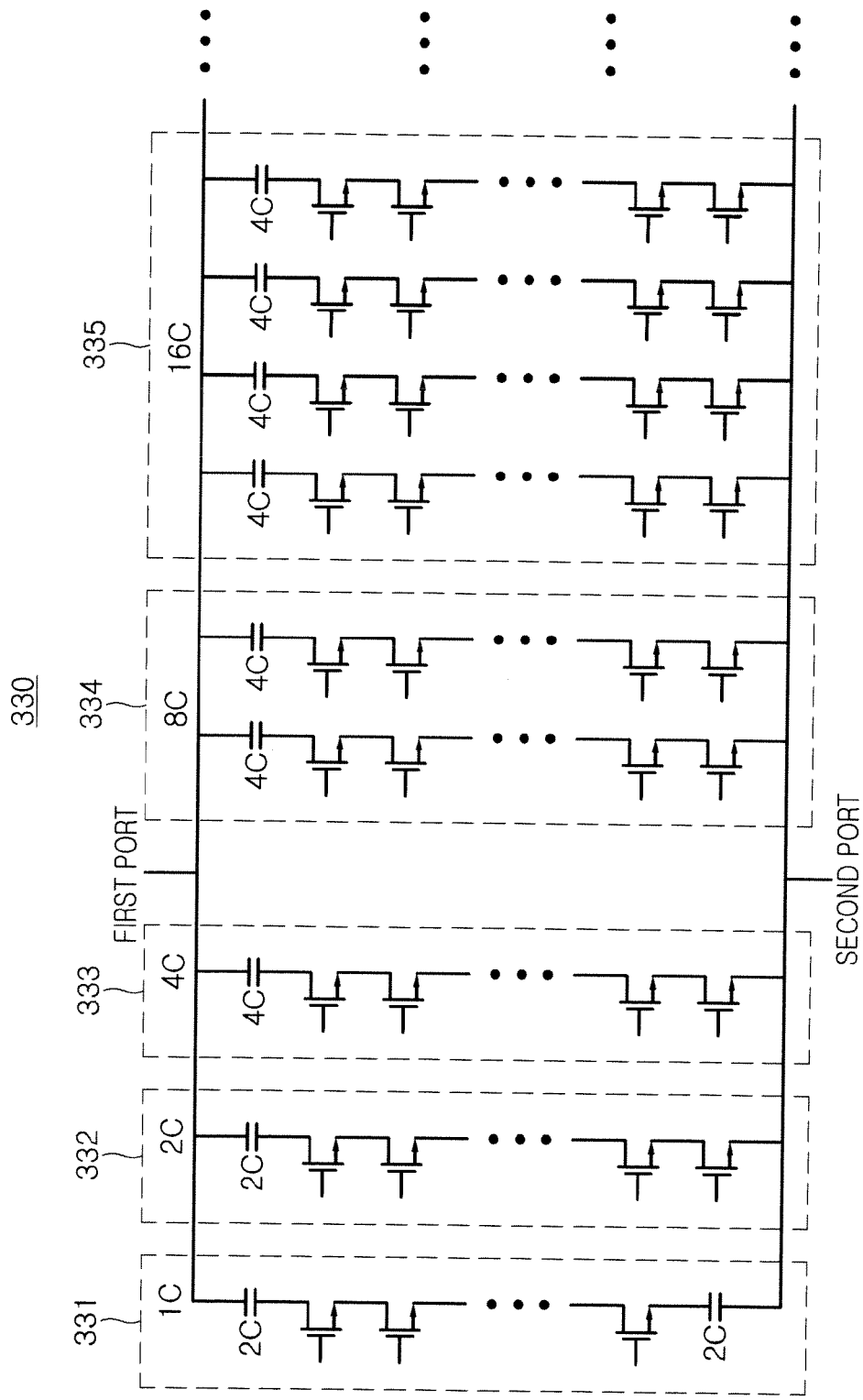

Referring to FIG. 3, a plurality of switches of a first switch portion may be connected to each other in series between first and second capacitors of a first capacitance forming portion 331 of a variable capacitor 330 employed in the IC of the present invention. A second capacitance forming portion 332 and capacitance forming groups 333, 334, and 335 are the same as those of FIGS. 1 and 2 and thus detailed descriptions thereof are omitted here.

Figure 4:
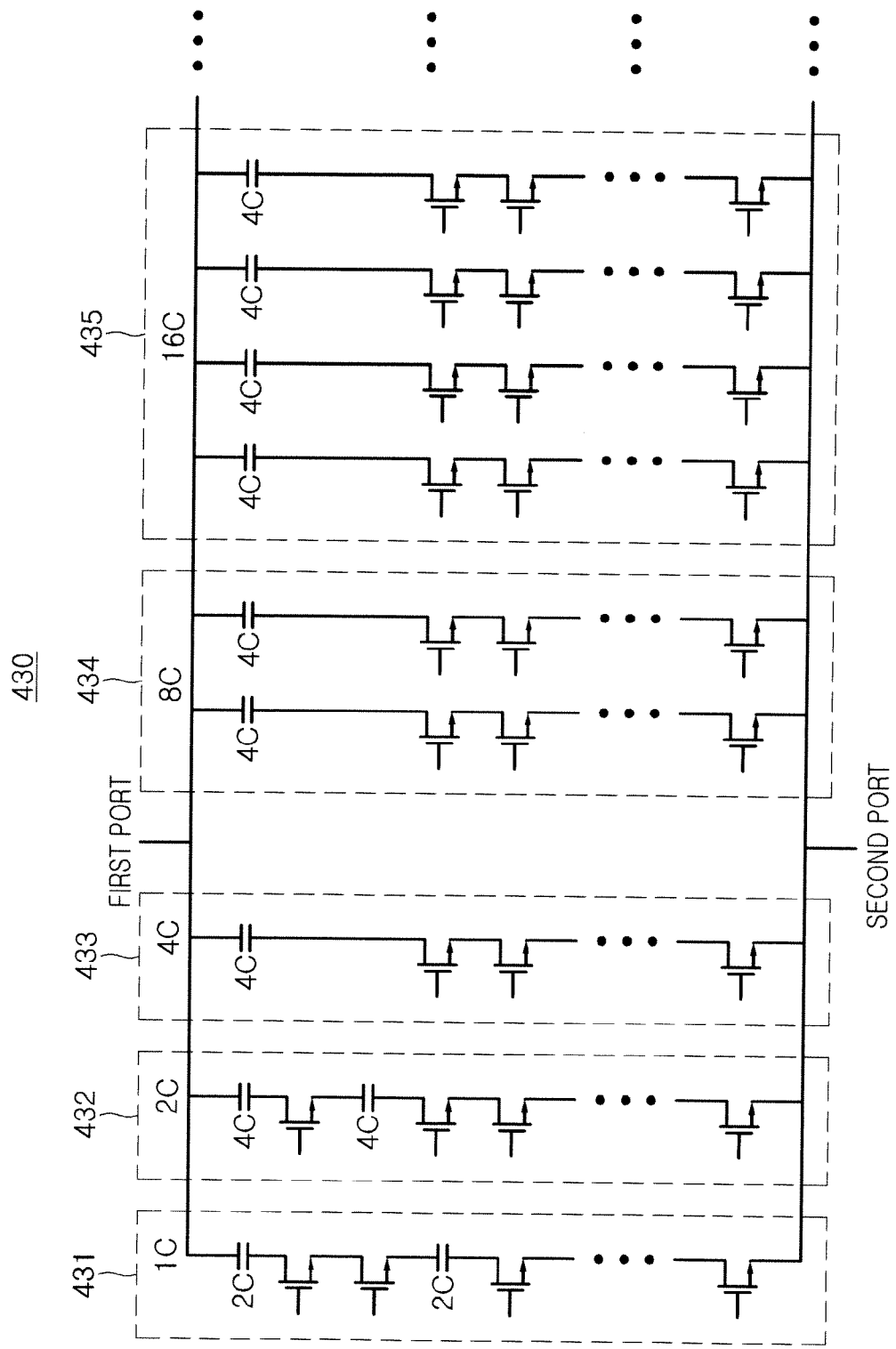
Figure 5:
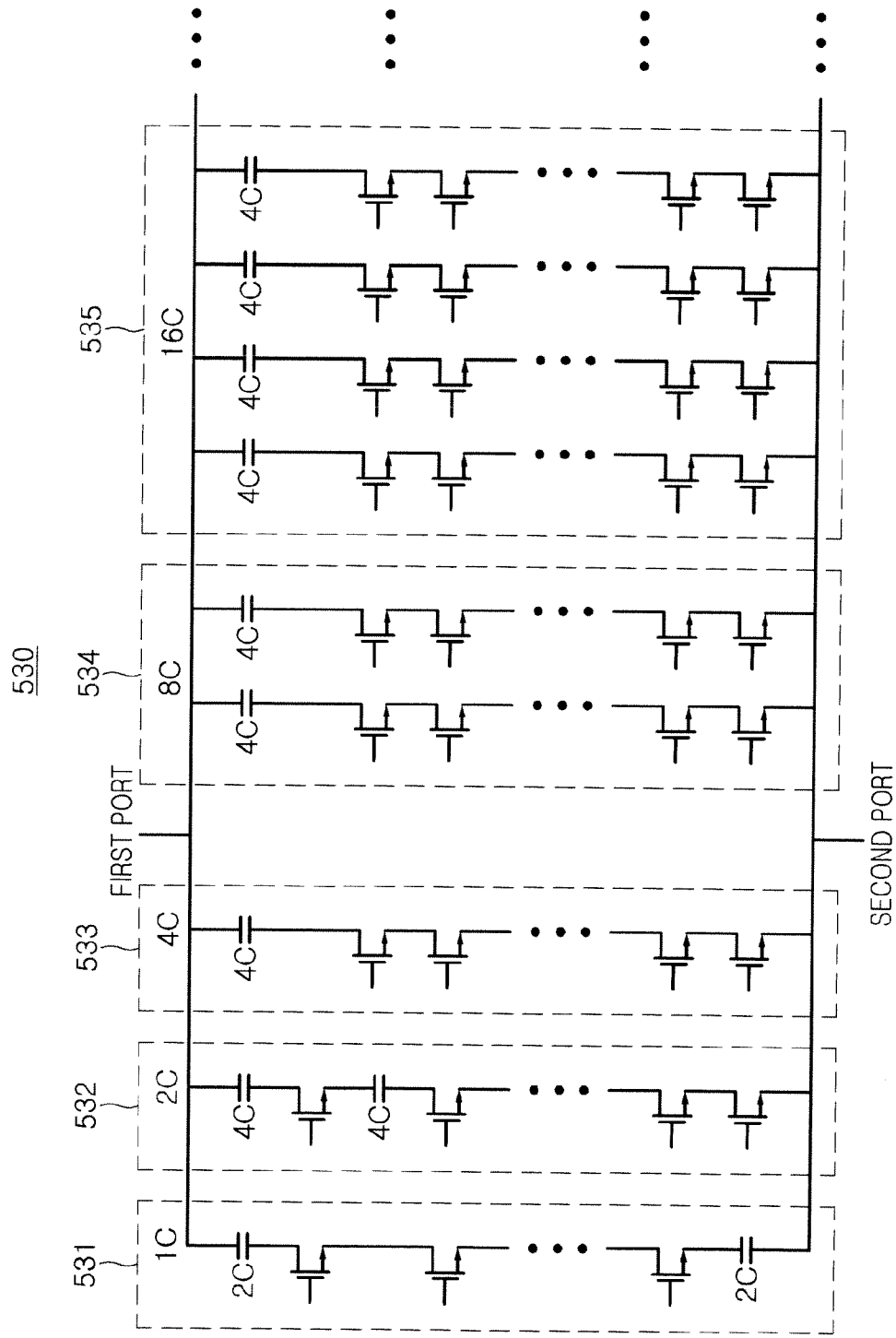

Referring to FIGS. 4 and 5, two switches may be connected to each other in series or a plurality of switches of a second switch portion may be connected to each other in series between first and second capacitors of second capacitance forming portions 432 and 532 of variable capacitors 430 and 530 employed in the IC of the present invention. First capacitance forming portions 431 and 531 and capacitance forming groups 433, 434, 435, 533, 534, and 535 are the same as those of FIGS. 2 and 3 and thus detailed descriptions thereof are omitted here.

Figure 6:
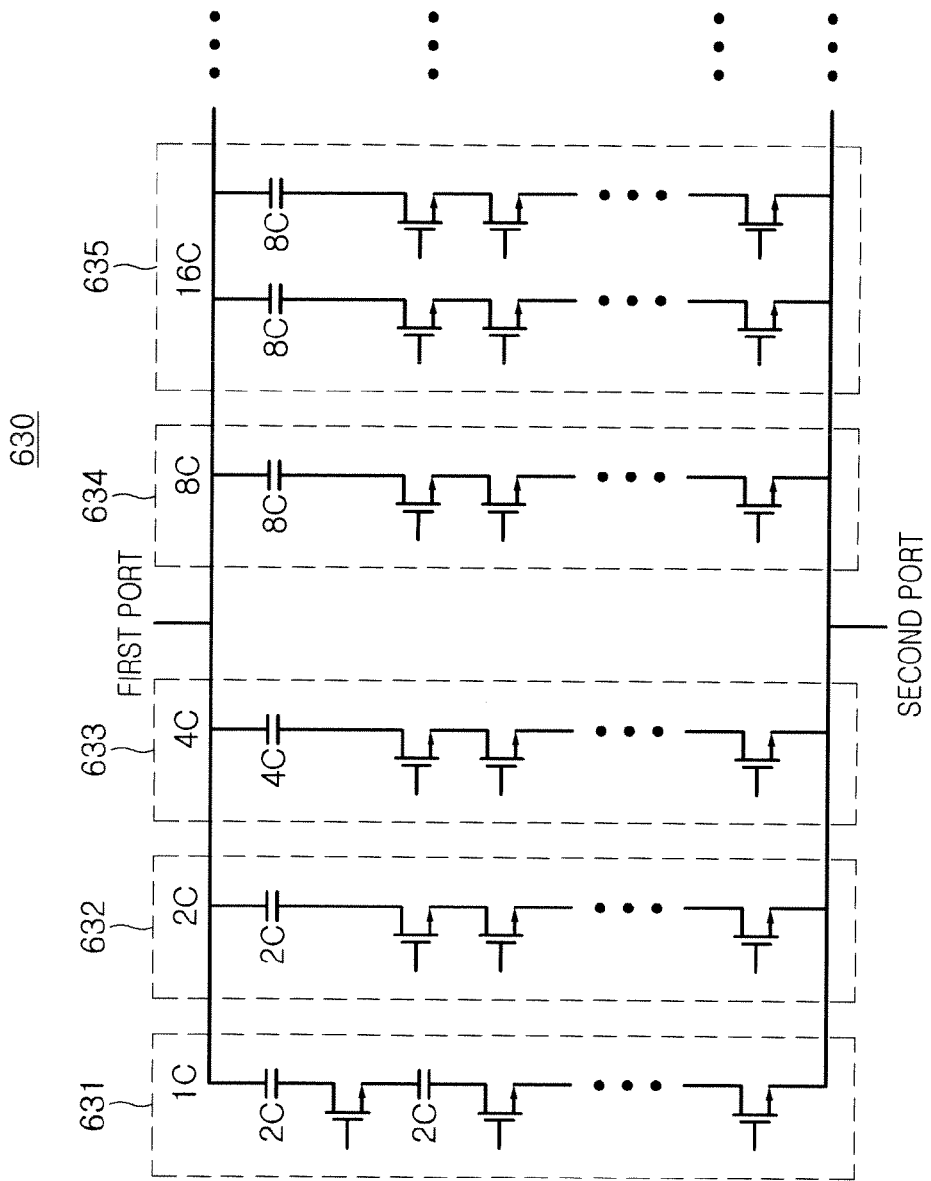

Referring to FIG. 6, a variable capacitor 630 employed in the IC of the present invention may include a third capacitance forming portion 633. The third capacitance forming portion 633 may have the same structure as a second capacitance forming portion 632. A capacitor of the third capacitance forming portion 633 may have two times larger capacitance than that of a capacitor of the second capacitance forming portion 632. An area of each of a plurality of switches of the third capacitance forming portion 633 may be two times larger than an area of each of a plurality of switches of the second capacitance forming portion 632.

Accordingly, respective capacitance forming groups 634 and 635 may include first and second unit capacitance forming units 634 and 635. The first unit capacitance forming unit 634 may include a single unit capacitance forming portion. The second unit capacitance forming unit 635 may include two unit capacitance forming portions connected to each other in parallel. Each of the unit capacitance forming portions may include a unit switch portion including a plurality of switches that switch capacitance forming paths according to a control signal, and a unit capacitor portion including a unit capacitor that is disposed between a first port and an initial switch of the unit switch portion and that provides the paths formed according to the switching of the unit switch portion with previously set capacitance. The unit capacitor may have two times larger capacitance than that of the capacitor of the third capacitance forming portion 633. An area of each of the plurality of switches of the unit switch portion may be two times larger than an area of each of the plurality of switches of the third capacitance forming portion 633.

The first capacitance forming portion 631 is the same as that of FIG. 1 and thus, a detailed description thereof is omitted here.

Figure 7:
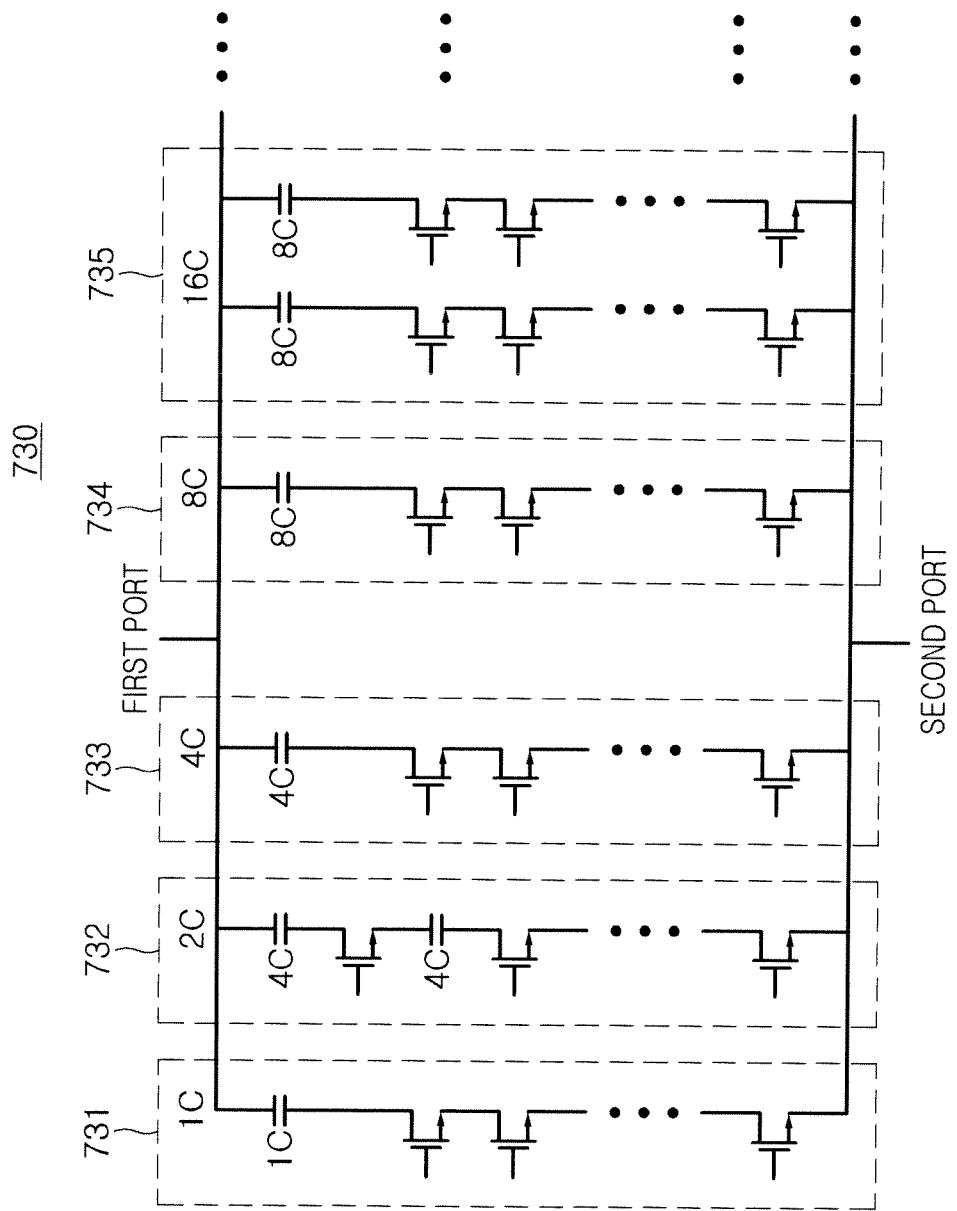

Referring to FIG. 7, a variable capacitor 730 employed in the IC of the present invention may include a third capacitance forming portion 731. The third capacitance forming portion 731 may have the same structure as a second capacitance forming portion 733. A capacitor of the third capacitance forming portion 731 may have ¼ smaller capacitance than that of a capacitor of the second capacitance forming portion 733. An area of each of a plurality of switches of the third capacitance forming portion 731 may be ¼ smaller than an area of each of a plurality of switches of a second switch portion.

Accordingly, respective capacitance forming groups 734 and 735 may include first and second unit capacitance forming units 734 and 735. The first unit capacitance forming unit 734 may include a single unit capacitance forming portion. The second unit capacitance forming unit 735 may include two unit capacitance forming portions connected to each other in parallel. Each of the unit capacitance forming portions may include a unit switch portion including a plurality of switches that switch capacitance forming paths according to the control signal, and a unit capacitor portion including a unit capacitor that is disposed between a first port and the initial switch of the unit switch portion and that provides the paths formed according to the switching of the unit switch portion with the previously set capacitance. The unit capacitor may have two times larger capacitance than that of the capacitor of the second capacitance forming portion 733. An area of each of the plurality of switches of the unit switch portion may be two times larger than an area of each of the plurality of switches of the second capacitance forming portion 733.

First and second capacitors of a first capacitance forming portion 732 may have the same capacitance as that of the capacitor of the second capacitance forming portion 733. In addition, an area of each of a plurality of switches of a first switch portion of the first capacitance forming portion 732 may be ½ of an area of each of a plurality of switches of a second switch portion of the second capacitance forming portion 733.

Figure 8:
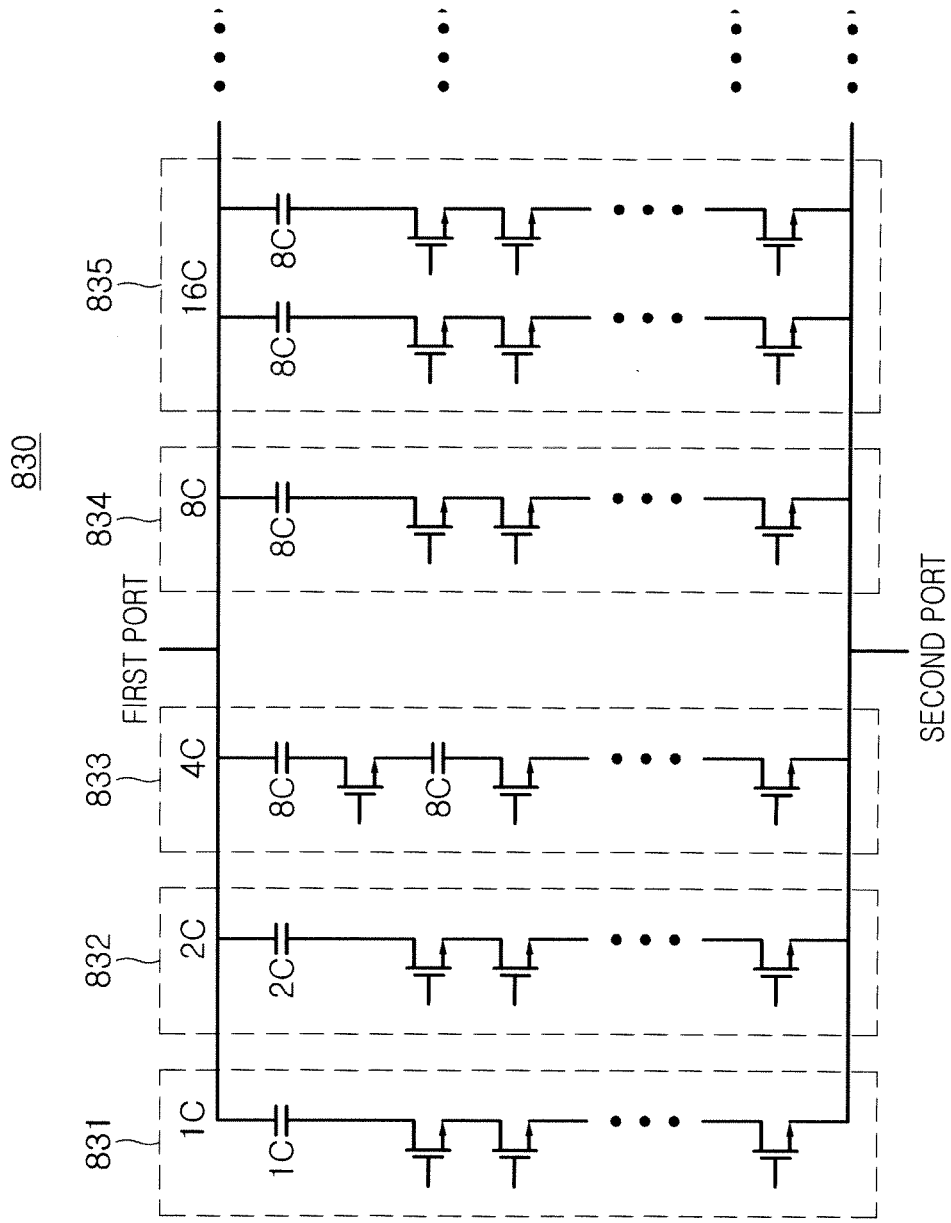

Referring to FIG. 8, a variable capacitor 830 employed in the IC of the present invention may include a third capacitance forming portion 831. The third capacitance forming portion 831 may have the same structure as a second capacitance forming portion 832. A capacitor of the third capacitance forming portion 831 may have ½ smaller capacitance than that of a capacitor of the second capacitance forming portion 832. An area of each of a plurality of switches of the third capacitance forming portion 831 may be ½ smaller than an area of each of a plurality of switches of a second switch portion.

First and second capacitors of a first capacitance forming portion 833 may have four times larger capacitance than that of the capacitor of the second capacitance forming portion 832. In addition, an area of each of a plurality of switches of a first switch portion of the first capacitance forming portion 833 may be two times larger than an area of each of a plurality of switches of a second switch portion of the second capacitance forming portion 832.

Accordingly, respective capacitance forming groups 834 and 835 may include first and second unit capacitance forming units 834 and 835. The first unit capacitance forming unit 834 may include a single unit capacitance forming portion. The second unit capacitance forming unit 835 may include two unit capacitance forming portions connected to each other in parallel. Each of the unit capacitance forming portions may include a unit switch portion including a plurality of switches that switch capacitance forming paths according to the control signal, and a unit capacitor portion including a unit capacitor that is disposed between a first port and the initial switch of the unit switch portion and that provides the paths formed according to the switching of the unit switch portion with the previously set capacitance. The unit capacitor may have the same capacitance as that of the capacitor of the first capacitance forming portion 833. An area of each of the plurality of switches of the unit switch portion may be two times larger than an area of each of the plurality of switches of the first capacitance forming portion 833.

Figure 9:
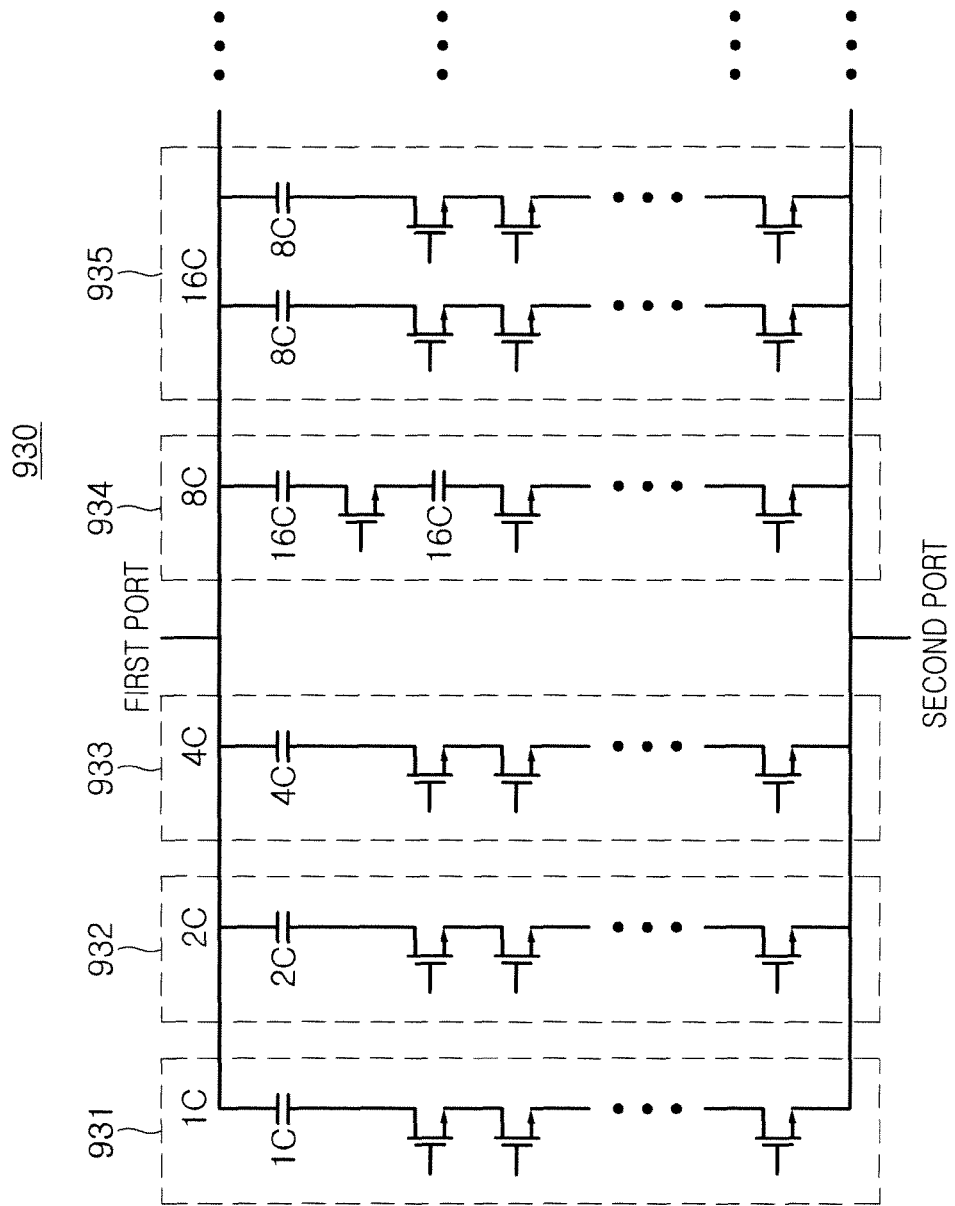

Referring to FIG. 9, a variable capacitor 930 employed in the IC of the present invention may include a third capacitance forming portion 931 and a fourth capacitance forming portion 932. The third capacitance forming portion 931 and the fourth capacitance forming portion 932 may have the same structure as a second capacitance forming portion 933. A capacitor of the third capacitance forming portion 931 may have ¼ smaller capacitance than that of a capacitor of the second capacitance forming portion 933. A capacitor of the fourth capacitance forming portion 932 may have ½ smaller capacitance than that of the capacitor of the second capacitance forming portion 933. An area of each of a plurality of switches of the third capacitance forming portion 931 may be ¼ smaller than an area of each of a plurality of switches of a second switch portion. An area of each of a plurality of switches of the fourth capacitance forming portion 932 may be ½ smaller than an area of each of the plurality of switches of the second switch portion.

First and second capacitors of a first capacitance forming portion 934 may have four times larger capacitance than that of the capacitor of the second capacitance forming portion 933. In addition, an area of each of a plurality of switches of a first switch portion of the first capacitance forming portion 934 may be two times larger than an area of each of a plurality of switches of a second switch portion of the second capacitance forming portion 933.

Accordingly, a capacitance forming group 935 may include a first unit capacitance forming unit 935. The first unit capacitance forming unit 935 may include two unit capacitance forming portions connected to each other in parallel. Each of the unit capacitance forming portions may include a unit switch portion including a plurality of switches that switch capacitance forming paths according to the control signal, and a unit capacitor portion including a unit capacitor that is disposed between a first port and the initial switch of the unit switch portion and that provides the paths formed according to the switching of the unit switch portion with the previously set capacitance. The unit capacitor may have ½ smaller capacitance than that of the capacitor of the first capacitance forming portion 934. An area of each of the plurality of switches of the unit switch portion may be the same as an area of each of the plurality of switches of the first capacitance forming portion 934.

As described above, according to embodiments of the present invention, capacitors are formed at both ends of a switch and receive voltages when the switch is turned off, and thus power handling characteristics may be improved. Further, repetitive unit capacitance forming portions are significantly reduced, which reduces the number of signal paths, thereby improving harmonic characteristics. A transistor switch having a non-uniform size is used, which significantly reduces a processing deviation. A size of the transistor switch increases, which reduces parasitic capacity, thereby increasing a Q value. A capacitance variation increment is also reduced, thereby facilitating tuning.

As set forth above, according to embodiments of the present invention, a constant Q value may be maintained and power handling characteristics and harmonic characteristics may be improved.

While the present invention has been shown and described in connection with the embodiments, it will be apparent to those skilled in the art that modifications and variations can be made without departing from the spirit and scope of the invention as defined by the appended claims.

What is claimed is:

1. A variable capacitor comprising:
a first capacitance forming portion, a second capacitance forming portion, and a capacitance forming group connected to each other in parallel between a first port and a second port having signals input and output therethrough and providing previously set capacitance according to a control signal,
wherein the first capacitance forming portion includes a first switch portion including a plurality of switches that switch a first capacitance forming path according to the control signal, and a first capacitor portion providing the first path formed according to the switching of the first switch portion with the previously set capacitance;
wherein the second capacitance forming portion includes a second switch portion including a plurality of switches that switch a second capacitance forming path according to the control signal, and a second capacitor portion including a capacitor that is disposed between the first port and an initial switch of the second switch portion and provides the second path formed according to the switching of the second switch portion with the previously set capacitance;
wherein the capacitance forming group includes at least one unit capacitance forming portion including at least one unit switch portion including a plurality of switches that switch a group capacitance forming path according to the control signal, and at least one unit capacitor portion including a unit capacitor disposed between the first port and an initial switch of the unit switch portion and providing the group path formed according to the switching of the unit switch portion with the previously set capacitance;
wherein the first capacitor portion includes a first capacitor and a second capacitor that are disposed across at least one switch of the first switch portion;
wherein the first and second capacitors of the first capacitor portion have the same capacitance;
wherein the capacitance of the first and second capacitors of the first capacitor portion is lower than the capacitance of the unit capacitor of the unit capacitor portion; and
wherein an area of each of the plurality of switches of the switch portion is configured differently than an area of each of the plurality of switches of the second switch portion.

2. The variable capacitor of claim 1, wherein the first and second capacitors of the first capacitor portion and the capacitor of the second capacitor portion have the same capacitance.

3. The variable capacitor of claim 1, wherein the second capacitor portion including a third capacitor and a fourth capacitor that are disposed across at least one switch of the second switch portion; wherein the third and fourth capacitors of the second capacitor portion have the same capacitance.

4. The variable capacitor of claim 3, wherein the capacitance of the third and fourth capacitors is the same as the capacitance of the unit capacitor of the unit capacitor portion.

5. The variable capacitor of claim 1, wherein the at least one capacitance forming group includes a plurality of the unit capacitance forming portions.

6. The variable capacitor of claim 5, wherein each of the plurality of the unit capacitance forming portions includes different amounts of the unit switch portions and the unit capacitor portions.

7. The variable capacitor of claim 6, wherein each of the plurality of the unit capacitance forming portions includes the nth power of 2 (n is an integer equal to or greater than 0) number of the unit switch portions and the unit capacitor portions.

8. An integrated circuit (IC) including a variable capacitor, comprising:
the variable capacitor including,
a first capacitance forming portion, a second capacitance forming portion, and a capacitance forming group connected to each other in parallel between a first port and a second port having signals input and output therethrough and providing previously set capacitance according to a control signal; and
a decoder providing the control signal according to a control from the outside;
wherein the first capacitance forming portion includes a first switch portion including a plurality of switches that switch a first capacitance forming path according to the control signal, and a first capacitor portion providing the first path formed according to the switching of the first switch portion with the previously set capacitance;
wherein the second capacitance forming portion includes a second switch portion including a plurality of switches that switch a second capacitance forming path according to the control signal, and a second capacitor portion including a capacitor that is disposed between the first port and an initial switch of the second switch portion and provides the second path formed according to the switching of the second switch portion with the previously set capacitance;
wherein the capacitance forming group includes at least one unit capacitance forming portion including at least one unit switch portion including a plurality of switches that switch a group capacitance forming path according to the control signal, and at least one unit capacitor portion including a unit capacitor disposed between the first port and an initial switch of the unit switch portion and providing the group path formed according to the switching of the unit switch portion with the previously set capacitance;
wherein the first capacitor portion includes a first capacitor and a second capacitor that are disposed across at least one switch of the first switch portion;
wherein the first and second capacitors of the first capacitor portion have the same capacitance;
wherein the capacitance of the first and second capacitors of the first capacitor portion is lower than the capacitance of the unit capacitor of the unit capacitor portion; and
wherein an area of each of the plurality of switches of the first switch portion is configured differently than an area of each of the plurality of switches of the second switch portion.

9. The IC of claim 8, wherein the first and second capacitors of the first capacitor portion and the capacitor of the second capacitor portion have the same capacitance.

10. The IC of claim 8, wherein the second capacitor portion includes a third capacitor and a fourth capacitor that are disposed across at least one switch of the second switch portion; and
wherein the third and fourth capacitors of the second capacitor portion have the same capacitance.

11. The IC of claim 10, wherein the capacitance of the third and fourth capacitors is the same as the capacitance of the unit capacitor of the unit capacitor portion.

12. The IC of claim 8, wherein the at least one capacitance forming group includes a plurality of the unit capacitance forming portions.

13. The IC of claim 12, wherein each of the plurality of the unit capacitance forming portions includes different amounts of the unit switch portions and the unit capacitor portions.

14. The IC of claim 13, wherein each of the plurality of the unit capacitance forming portions includes the nth power of 2 (n is an integer equal to or greater than 0) number of the unit switch portions and the unit capacitor portions.

15. The IC of claim 8, further comprising an interface that transfers the control from the outside to the decoder by using a previously set interfacing method.

16. The variable capacitor of claim 1, further comprising a third capacitance forming portion connected between the first port and the second port;
wherein the third capacitance forming portion includes a third switch portion including a plurality of switches that switch a third capacitance forming path according to the control signal, and a third capacitor portion including a capacitor that is disposed between the first port and an initial switch of the third switch portion and provides the third path formed according to the switching of the third switch portion with the previously set capacitance; and
wherein the capacitance of the capacitor of the third capacitor portion is higher than the capacitance of the first and second capacitors of the first capacitor portion, and is lower than the capacitance of the unit capacitor of the unit capacitor portion.

17. A variable capacitor comprising:
a first capacitance forming portion, a second capacitance forming portion, a third capacitance forming portion, and a capacitance forming group connected to each other in parallel between a first port and a second port having signals input and output therethrough and providing previously set capacitance according to a control signal,
wherein the first capacitance forming portion includes a first switch portion including a plurality of switches that switch a first capacitance forming path according to the control signal, and a first capacitor portion including a capacitor that is disposed between the first port and an initial switch of the first switch portion and provides the first path formed according to the switching of the first switch portion with the previously set capacitance;
wherein the second capacitance forming portion includes a second switch portion including a plurality of switches that switch a second capacitance forming path according to the control signal, and a second capacitor portion including a capacitor that is disposed between the first port and an initial switch of the second switch portion and provides the second path formed according to the switching of the second switch portion with the previously set capacitance;
wherein the third capacitance forming portion includes a third switch portion including a plurality of switches that switch a third capacitance forming path according to the control signal, and a third capacitor portion including a capacitor that is disposed between the first port and an initial switch of the third switch portion and provides the third path formed according to the switching of the third switch portion with the previously set capacitance;
wherein the capacitance forming group includes at least one unit capacitance forming portion including at least one unit switch portion including a plurality of switches that switch a group capacitance forming path according to the control signal, and at least one unit capacitor portion including a unit capacitor disposed between the first port and an initial switch of the unit switch portion and providing the group path formed according to the switching of the unit switch portion with the previously set capacitance;

wherein the capacitance of the capacitor of the first capacitor portion is lower than the capacitance of the unit capacitor of the unit capacitor portion;

wherein the second capacitor portion or the third capacitor portion includes a first capacitor and a second capacitor that are disposed across at least one switch of the second switch portion or the third switch portion;

wherein first and second capacitors of the second capacitor portion or the third capacitor portion have the same capacitance; and wherein an area of each of the plurality of switches of the first switch portion is configured differently than an area of each of the plurality of switches of the third switch portion.

18. The variable capacitor of claim 1, wherein the first and second capacitors of the second capacitor portion and the capacitor of the third capacitor portion have the same capacitance; or wherein the first and second capacitors of the third capacitor portion and the unit capacitor of the unit capacitor portion have the same capacitance.

19. A variable capacitor comprising:
a first capacitance forming portion, a second capacitance forming portion, a third capacitance forming portion, and a capacitance forming group connected to each other in parallel between a first port and a second port having signals input and output therethrough and providing previously set capacitance according to a control signal, wherein the first capacitance forming portion includes a first switch portion including a plurality of switches that switch a first capacitance forming path according to the control signal, and a first capacitor portion including a capacitor that is disposed between the first port and an initial switch of the first switch portion and provides the first path formed according to the switching of the first switch portion with the previously set capacitance;

wherein the second capacitance forming portion includes a second switch portion including a plurality of switches that switch a second capacitance forming path according to the control signal, and a second capacitor portion including a capacitor that is disposed between the first port and an initial switch of the second switch portion and provides the second path formed according to the switching of the second switch portion with the previously set capacitance;

wherein the third capacitance forming portion includes a third switch portion including a plurality of switches that switch a third capacitance forming path according to the control signal, and a third capacitor portion including a capacitor that is disposed between the first port and an initial switch of the third switch portion and provides the third path formed according to the switching of the third switch portion with the previously set capacitance;

wherein the capacitance forming group includes a plurality of the unit capacitance forming portions;

wherein the plurality of the unit capacitance forming portions includes at least one unit switch portion including a plurality of switches that switch a unit capacitance forming path according to the control signal, and at least one unit capacitor portion including a unit capacitor disposed between the first port and an initial switch of the unit switch portion and providing the unit path formed according to the switching of the unit switch portion with the previously set capacitance;

wherein at least one unit capacitor portion of at least one unit capacitance forming portion among the plurality of the unit capacitance forming portions includes a first unit capacitor and a second unit capacitor that are disposed across at least one switch of the unit switch portion;

wherein the capacitance of the capacitor of the first capacitor portion is lower than the capacitance of the unit capacitor of the unit capacitor portion; and wherein an area of each of the plurality of switches of the second switch portion is configured differently than an area of each of the plurality of switches of the third switch portion.

20. The IC of claim 8, wherein the variable capacitor further including a third capacitance forming portion connected between the first port and the second port;

wherein the third capacitance forming portion includes a third switch portion including a plurality of switches that switch a third capacitance forming path according to the control signal, and a third capacitor portion including a capacitor that is disposed between the first port and an initial switch of the third switch portion and provides the third path formed according to the switching of the third switch portion with the previously set capacitance;

wherein the capacitance of the capacitor of the third capacitor portion is higher than the capacitance of the first and second capacitors of the first capacitor portion, and is lower than the capacitance of the unit capacitor of the unit capacitor portion.

21. An integrated circuit (IC) including a variable capacitor, comprising:
the variable capacitor including, a first capacitance forming portion, a second capacitance forming portion, a third capacitance forming portion, and a capacitance forming group connected to each other in parallel between a first port and a second port having signals input and output therethrough and providing previously set capacitance according to a control signal; and
a decoder providing the control signal according to a control from an outside, wherein the first capacitance forming portion includes a first switch portion including a plurality of switches that switch a first capacitance forming path according to the control signal, and a first capacitor portion including a capacitor that is disposed between the first port and an initial switch of the first switch portion and provides the first path formed according to the switching of the first switch portion with the previously set capacitance;

wherein the second capacitance forming portion includes a second switch portion including a plurality of switches that switch a second capacitance forming path according to the control signal, and a second capacitor portion including a capacitor that is disposed between the first port and an initial switch of the second switch portion and provides the second path formed according to the switching of the second switch portion with the previously set capacitance;

wherein the third capacitance forming portion includes a third switch portion including a plurality of switches that switch a third capacitance forming path according to the control signal, and a third capacitor portion including a capacitor that is disposed between the first port and an initial switch of the third switch portion and provides the third path formed according to the switching of the third switch portion with the previously set capacitance;

wherein the capacitance forming group includes at least one unit capacitance forming portion including at least one unit switch portion including a plurality of switches that switch a group capacitance forming path according to the control signal, and at least one unit capacitor portion including a unit capacitor disposed between the first port and an initial switch of the unit switch portion and providing the unit path formed according to the switching of the unit switch portion with the previously set capacitance;

wherein the capacitance of the capacitor of the first capacitor portion is lower than the capacitance of the unit capacitor of the unit capacitor portion;

wherein the second capacitor portion or the third capacitor portion includes a third capacitor and a fourth capacitor that are disposed across at least one switch of the second switch portion or the third switch portion;

wherein the third and fourth capacitors of the second capacitor portion or the third capacitor portion have the same capacitance; and wherein an area of each of the plurality of switches of the first switch portion is configured differently than an area of each of the plurality of switches of the second switch portion.

22. The variable capacitor of claim 8, wherein the third and fourth capacitors of the second capacitor portion and the capacitor of the third capacitor portion have the same capacitance; or wherein the third and fourth capacitors of the third capacitor portion and the unit capacitor of the unit capacitor portion have the same capacitance.

23. An integrated circuit (IC) including a variable capacitor, comprising:
the variable capacitor including, a first capacitance forming portion, a second capacitance forming portion, a third capacitance forming portion, and a capacitance forming group connected to each other in parallel between a first port and a second port having signals input and output therethrough and providing previously set capacitance according to a control signal; and
a decoder providing the control signal according to a control from an outside,
wherein the first capacitance forming portion includes a first switch portion including a plurality of switches that switch a first capacitance forming path according to the control signal, and a first capacitor portion including a capacitor that is disposed between the first port and an initial switch of the first switch portion and provides the first path formed according to the switching of the first switch portion with the previously set capacitance;
wherein the second capacitance forming portion includes a second switch portion including a plurality of switches that switch a second capacitance forming path according to the control signal, and a second capacitor portion including a capacitor that is disposed between the first port and an initial switch of the second switch portion and provides the second path formed according to the switching of the second switch portion with the previously set capacitance;
wherein the third capacitance forming portion includes a third switch portion including a plurality of switches that switch a third capacitance forming path according to the control signal, and a third capacitor portion including a capacitor that is disposed between the first port and an initial switch of the third switch portion and provides the third path formed according to the switching of the third switch portion with the previously set capacitance;
wherein the capacitance forming group includes a plurality of the unit capacitance forming portions;
wherein the plurality of the unit capacitance forming portions includes at least one unit switch portion including a plurality of switches that switch a unit capacitance forming path according to the control signal, and at least one unit capacitor portion including a unit capacitor disposed between the first port and an initial switch of the unit switch portion and providing the unit path formed according to the switching of the unit switch portion with the previously set capacitance;
wherein at least one unit capacitor portion of at least one unit capacitance forming portion among the plurality of the unit capacitance forming portions includes a first unit capacitor and a second unit capacitor that are disposed across at least one switch of the unit switch portion;
wherein the capacitance of the capacitor of the first capacitor portion is lower than the capacitance of the unit capacitor of the unit capacitor portion; and
wherein an area of each of the plurality of switches of the first switch portion is configured differently than an area of each of the plurality of switches of the second switch portion.

\* \* \* \* \*